United States Patent
Yang et al.

(10) Patent No.: US 8,044,389 B2
(45) Date of Patent: Oct. 25, 2011

(54) POLYMER ELECTRONIC DEVICES BY ALL-SOLUTION PROCESS

(75) Inventors: Yang Yang, Los Angeles, CA (US); Jinsong Huang, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 9 days.

(21) Appl. No.: 12/598,547

(22) PCT Filed: Jul. 28, 2008

(86) PCT No.: PCT/US2008/009107
§ 371 (c)(1),
(2), (4) Date: Nov. 2, 2009

(87) PCT Pub. No.: WO2009/017700
PCT Pub. Date: Feb. 5, 2009

(65) Prior Publication Data
US 2010/0127247 A1    May 27, 2010

Related U.S. Application Data (60) Provisional application No. 60/935,137, filed on Jul. 27, 2007.

(51) Int. Cl.
*H01L 51/00* (2006.01)
(52) U.S. Cl. ............... 257/40; 257/E51.01; 257/E51.07; 257/E51.024; 257/E21.007; 438/82; 438/99
(58) Field of Classification Search .............. 257/40, 257/E51.01, E51.017, E51.024, E21.007; 438/82, 99
See application file for complete search history.

(56) References Cited

U.S. PATENT DOCUMENTS

| | | |
|---|---|---|
| 6,592,969 B1 | 7/2003 | Burroughes et al. |
| 2003/0096106 A1* | 5/2003 | Verlinden et al. ............. 428/332 |
| 2005/0159580 A1* | 7/2005 | Liu et al. ....................... 528/373 |
| 2005/0248272 A1 | 11/2005 | Koike et al. |
| 2005/0250244 A1 | 11/2005 | Li et al. |
| 2005/0260786 A1* | 11/2005 | Yoshikawa et al. ............. 438/85 |
| 2006/0131567 A1* | 6/2006 | Liu et al. ........................ 257/40 |
| 2006/0158735 A1 | 7/2006 | Tonar et al. |
| 2007/0087469 A1* | 4/2007 | Daniels ........................... 438/99 |
| 2007/0240756 A1* | 10/2007 | Lee et al. ...................... 136/252 |
| 2007/0290198 A1* | 12/2007 | Goldfinger ..................... 257/40 |
| 2008/0017852 A1* | 1/2008 | Huh et al. ....................... 257/40 |
| 2009/0286097 A1 | 11/2009 | Yang |
| 2010/0096004 A1* | 4/2010 | Hu et al. ....................... 136/256 |

OTHER PUBLICATIONS

International Search Report and Written Opinion, Mailed Oct. 30, 2008, Issued in PCT/US2008/009107.

Peumans, P.; et al., "Small molecular weight organic thin-film photodetectors and solar cells," J. Appl. Phys. (2003), vol. 93, p. 3693.

(Continued)

*Primary Examiner* — Tu-Tu V Ho
(74) *Attorney, Agent, or Firm* — Venable LLP; Henry J. Daley (57) ABSTRACT

A method of producing an electronic or electro-optic device, and the devices produced, includes producing a first electrode by a solution process, producing a second electrode by a solution process, and lamination an active polymer layer between the first and second electrodes.

20 Claims, 7 Drawing Sheets

OTHER PUBLICATIONS

Li, G. et al., "High-efficiency solution processable polymer photovoltaic cells by self-organization of polymer blends," Nat. Mater. (2005), vol. 4, p. 864.

Huang, J. et al., "Achieving High-efficiency polymer white-light-emitting devices," Adv. Mater. (2006) vol. 18, p. 114.

Huang, J. et al., "Highly efficient red-emission polymer phosphorescent light-emitting diodes based on two novel tris(1-phenylisoquinolinato-C2,N)iridium(III) derivatives," Adv. Mater, 2007, 19, 739-743.

Ouyang, J. et al., "Conducting polymer as transparent electric glue," Adv. Mater. (2006) vol. 18, p. 2141.

Huang, J. et al., "Influence of composition and heat-treatment on the charge transport properties of poly(3-hexylthiophene) and [6,6]-phenyl C61-butyric acid methyl ester blends," Appl. Phys. Lett. (2005), vol. 87, p. 112105.

Shrotriya, V. et al., "Effect of self-organization in polymer/fullerene bulk heterojunctions on solar cell performance," Appl. Phys. Lett. (2006), vol. 89, p. 063505.

Shrotriya, V., et al., "Efficient light harvesting in multiple-device stacked structure for polymer solar cells," Appl. Phys. Lett. (2006), vol. 88, p. 064104.

Huang, J., et al., "Investigation of the effects of doping and post-deposition treatments on the conductivity, morphology, and work function of poly(3,4-ethylenedioxythiophene)/poly(styrene sulfonate) films," Adv. Funct. Mater. (2005), vol. 15, p. 290.

Yang, F. et al., "Controlled growth of a molecular bulk heterojunction photovoltaic cell," Nat. Mater. (2005), vol. 4, p. 37.

Waldauf, C. et al., "Highly efficient inverted organic photovoltaics using solution based titanium oxide as electron selective contact," Appl. Phys. Lett. (2006), vol. 89, p. 233517.

Khodabakhsh, S., et al., "Using self-assembling dipole molecules to improve hole injection in conjugated polymers," Adv. Funct. Mater. (2004), vol. 14, p. 1205.

Khodabakhsh, S., et al., "Using self-assembling dipole molecules to improve charge collection in molecular solar cells," Adv. Funct. Mater. (2006), vol. 16, p. 95.

Brabec, C.J. et al., "Origin of the open circuit voltage of plastic solar cells," Adv. Funct. Mater. (2001), vol. 11, p. 374.

Tang, C.W. et al., Appl. Phys. Lett. (1987), vol. 51, p. 913.

Tang, C.W. et al., Appl. Phys. Lett. (1986), vol. 48, p. 183.

Bao, Z. et al., Appl. Phys. Lett. (1996), vol. 69, p. 3066.

Ma, L.P. et al., Appl. Phys. Lett. (2002), vol. 80, p. 2997.

Forrest, S.R., Nature (2004), vol. 428, p. 911.

Halls, J.J.M. et al., "Efficient photodiodes from interpenetrating polymer networks," Nature (1995), vol. 376, p. 498.

Sariciftci, N.S. et al., "Photoinduced Electron Transfer from a Conducting Polymer to Buckminster-fullerene," Science (1992), vol. 258, p. 1474.

Brabec, C.J. et al., "Production aspects of organic photovoltaics and their impact on the commercialization of devices," MRS Bulletin (2005), vol. 30, p. 50.

Janssen, R.A.J. et al., "Polymer-fullerene bulk heterojunction solar cells," MRS Bulletin, (2005), vol. 33, p. 50.

\* cited by examiner

scattering light

POLYMER ELECTRONIC DEVICES BY ALL-SOLUTION PROCESS

CROSS REFERENCE TO RELATED APPLICATIONS

This application is a U.S. National Stage Application of PCT/US2008/009107 filed Jul. 28, 2008, which claims priority to U.S. Provisional Application No. 60/935,137, filed Jul. 27, 2007, the entire contents of which are incorporated herein by reference.

BACKGROUND

1. Field of Invention

Embodiments of this invention relate to polymer electronic devices and methods of producing polymer electronic devices, and more particularly to all-solution processes and polymer electronic devices made by all-solution processes.

2. Discussion of Related Art

The contents of all references referred to herein, including articles, published patent applications and patents are hereby incorporated by reference.

Electronic devices based on organic materials (small molecules and polymers) have attracted broad interest. Such devices include organic light emitting devices (OLEDs) (Tang, C. W.; VanSlyke, S. A.; *Appl. Phys. Lett.* 1987, 51, 913), organic photovoltaic cells (OPVs) (Tang, C. W. *Appl. Phys. Lett.* 1986, 48, 183), transistors (Bao, Z.; Lovinger, A. J.; Dodabalapur, A. *Appl. Phys. Lett.* 1996, 69, 3066), bistable devices and memory devices (Ma, L. P.; Liu, J.; Yang, Y. *Appl. Phys. Lett.* 2002, 80, 2997), etc. Some of the most salient attributes of polymer electronics is that they can be very low-cost, flexible, operate with low-energy consumption, can be produced with high-throughput processing, and can be versatile for a range of applications (Forrest, S. R. *Nature* 2004, 428, 911). To achieve low cost production, solution processing is highly desirable.

Solar cells, also known as photovoltaic (PV) cells or devices, generate electrical power from incident light. The term "light" is used broadly herein to refer to electromagnetic radiation which may include visible, ultraviolet and infrared light.

Traditionally, PV cells have been constructed of a number of inorganic semiconductors, e.g., crystalline, polycrystalline and amorphous silicon, gallium arsenide, cadmium telluride and others. More recently, PV cells have been constructed using organic materials.

Solar cells are characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs as well as other possible advantageous properties.

PV devices produce a photo-generated voltage when they are connected across a load and are irradiated by light. When irradiated without any external electronic load, a PV device generates its maximum possible voltage, V open-circuit, or $V_{OC}$. If a PV device is irradiated with its electrical contacts shorted, a maximum short-circuit current, or $I_{SC}$, is produced. (Current is conventionally referred to as "I" or "J".) When actually used to generate power, a PV device is connected to a finite resistive load in which the power output is given by the product of the current and voltage, I×V. The maximum total power generated by a PV device is inherently incapable of exceeding the product $I_{SC} \times V_{OC}$. When the load value is optimized for maximum power extraction, the current and voltage have values, $I_{max}$ and $V_{max}$, respectively. A figure of merit for solar cells is the fill factor, ff (or FF), defined as:

$$ff = \frac{I_{max} V_{max}}{I_{SC} V_{OC}}$$

where ff is always less than 1, as $I_{SC}$ and $V_{OC}$ are never achieved simultaneously in actual use. Nonetheless, as ff approaches 1, the device is more efficient.

When electromagnetic radiation of an appropriate energy is incident upon a semiconductive organic material, for example, an organic molecular crystal (OMC) material, or a polymer, a photon can be absorbed to produce an excited molecular state. This energy absorption is associated with the promotion of an electron from a bound state in the highest occupied molecular orbital (HOMO) to the lowest unoccupied molecular orbital (LUMO), or equivalently, the promotion of a hole from the LUMO to the HOMO. In organic thin-film photoconductors, the generated excited state is believed to be an exciton, i.e., an electron-hole pair in a bound state which is transported as a quasi-particle. The excitons can have an appreciable life-time before recombination. To produce a photocurrent the electron-hole pair must become separated, for example at a donor-acceptor interface between two dissimilar contacting organic thin films. The interface of these two materials is called a photovoltaic heterojunction If the charges do not separate, they can recombine with each other (known as quenching) either radiatively, by the emission of light of a lower energy than the incident light, or non-radiatively, by the production of heat. Either of these outcomes is undesirable in a PV device. In traditional semiconductor theory, materials for forming PV heterojunctions have been denoted as generally being of either n (donor) type or p (acceptor) type. Here n-type denotes that the majority carrier type is the electron. This could be viewed as the material having many electrons in relatively free energy states. The p-type denotes that the majority carrier type is the hole. Such material has many holes in relatively free energy states. The type of the background majority carrier concentration depends primarily on unintentional doping by defects or impurities. The type and concentration of impurities determine the value of the Fermi energy, or level, within the gap between the highest occupied molecular orbital (HOMO) and the lowest unoccupied molecular orbital (LUMO), called the HOMO-LUMO gap. The Fermi energy characterizes the statistical occupation of molecular quantum energy states denoted by the value of energy for which the probability of occupation is equal to ½. A Fermi energy near the LUMO energy indicates that electrons are the predominant carrier. A Fermi energy near the HOMO energy indicates that holes are the predominant carrier. Accordingly, the Fermi energy is a primary characterizing property of traditional semiconductors and the PV heterojunction has traditionally been the p-n interface.

A significant property in organic semiconductors is carrier mobility. Mobility measures the ease with which a charge carrier can move through a conducting material in response to an electric field. As opposed to free carrier concentrations, carrier mobility is determined in large part by intrinsic properties of the organic material such as crystal symmetry and periodicity. Appropriate symmetry and periodicity can produce higher quantum wavefunction overlap of HOMO levels producing higher hole mobility, or similarly, higher overlap of LUMO levels to produce higher electron mobility. Moreover, the donor or acceptor nature of an organic semiconductor may be at odds with the higher carrier mobility. The result is that device configuration predictions from donor/acceptor criteria may not be borne out by actual device performance. Due to these electronic properties of organic materials, the nomenclature of "hole-transporting-layer" (HTL) or "electron-transporting-layer" (ETL) is often used rather than designating them as "p-type" or "acceptor-type" and "n-type" or "donor-type". In this designation scheme, an ETL will be preferentially electron conducting and an HTL will be preferentially hole transporting.

Organic PV cells have many potential advantages when compared to traditional silicon-based devices. Organic PV cells are light weight, economical with respect to the materials used, and can be deposited on low cost substrates, such as flexible plastic foils. (See, for example, J. J. M. Halls et al. Efficient photodiodes from interpenetrating polymer networks. Nature 376, 498 (1995); N. S. Sariciftci, L. Smilowitz, A. J. Heeger, and F. Wudl, Photoinduced Electron Transfer from a Conducting Polymer to Buckminsterfullerene. Science 258, 1474 (1992); C. J. Brabec, J. A. Hauch, P. Schilinsky, and C. Waldauf, Production aspects of organic photovoltaics and their impact on the commercialization of devices. MRS bulletin, 30, 50 (2005); René A. J. Janssen, Jan C. Hummelen, and N. Serdar Sariciftci, Polymer-fullerene bulk heterojunction solar cells. MRS bulletin, 33, 50 (2005); C. W. Tang, Two-layer organic photovoltaic cell. Appl. Phys. Lett. 48, 183 (1986); P. Peumans, A. Yakimov, and S. R. Forrest, Small molecular weight organic thin-film photodetectors and solar cells. J. Appl. Phys. 93, 3693 (2003); and G. Li, et al. High-efficiency solution processable polymer photovoltaic cells by self-organization of polymer blends. Nat. Mater. 4, 864 (2005).) Polymer solar cells have a typical structure of anode/polymer layer/cathode. For such devices, thermal evaporation processing under ultra-high vacuum is conventionally used for the deposition of the final cathode. This conventional process uses expensive and time-consuming vacuum deposition for the metal contacts. Small molecule based organic solar cells have a particular disadvantage in that they require critical control of the thickness of the multilayer device structure over a large area. In addition, low work function metals such as calcium are typically used in order to improve the performance. The degradation of the reactive metal cathode and metal/polymer interface inevitably leads to decreased device performance and sophisticated encapsulation schemes are required to prevent reaction with moisture and oxygen in the air. Consequently, there remains a need for improved organic electronic devices.

SUMMARY

A method of producing an electronic or electro-optic device according to an embodiment of the current invention includes producing a first electrode by a solution process, producing a second electrode by a solution process, and laminating an active polymer layer between the first and second electrodes. An electronic or electro-optic device according to an embodiment of the current invention is produced by producing a first electrode by a solution process, producing a second electrode by a solution process, and laminating an active polymer layer between the first and second electrodes.

An organic electronic or electro-optic device according to an embodiment of the current invention has a first electrode consisting essentially of organic material, a second electrode consisting essentially of organic material, an active polymer layer arranged between the first and second electrodes, and conductive polymer glue disposed between the first electrode and the active polymer layer. The conductive polymer glue provides mechanical bonding and electrical connection of the first electrode to the active polymer layer.

BRIEF DESCRIPTION OF THE DRAWINGS

The invention may be better understood by reading the following detailed description with reference to the accompanying figures in which.

DETAILED DESCRIPTION

In describing embodiments of the present invention, specific terminology is employed for the sake of clarity. However, the invention is not intended to be limited to the specific terminology so selected. It is to be understood that each specific element includes all technical equivalents which operate in a similar manner to accomplish a similar purpose.

According to an embodiment of the current invention, we provide a method to make electronic devices by an all-solution process. This method can provide a novel device architecture based on a plastic lamination method for fabricating polymer solar cells, for example, where the conventional vacuum evaporation step can be completely eliminated during the process according to some embodiments of the current invention. However, the method is not limited to only producing solar cells. Other electronic and/or electro-optic devices can be produced according to some embodiments of the current invention.

Figure 1A:
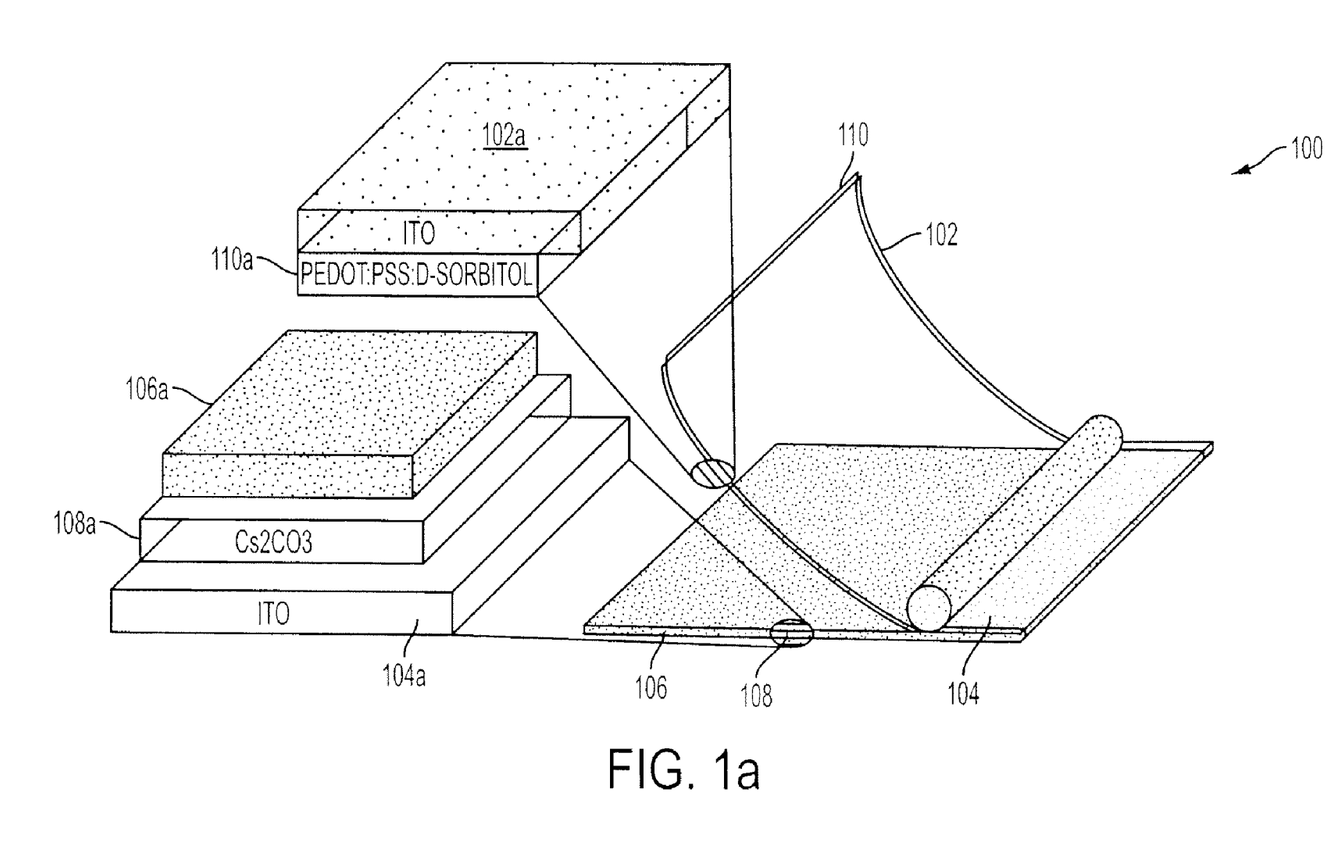
FIG. 1(a) is a schematic illustration of an electronic or electro-optic device according to an embodiment of the current invention which also facilitates an explanation of a method of manufacturing such devices according to an embodiment of the current invention.

FIG. 1(a) is a schematic illustration that facilitates the description of a manufacturing process according to an embodiment of the current invention as well as the description of a device 100 according to an embodiment of the current invention. The device 100 can be an electronic device or an electro-optic device, for example, but for simplicity, it will be referred to as an electronic device without excluding other possible devices such as electro-optic devices, i.e., the term "electronic device" here is intended to also refer to electro-optic devices. The electronic device 100 is an organic electronic device that has a first transparent electrode 102, a second transparent electrode 104 and an electronically active polymer layer 106. The electronically active polymer layer 106 can also be an electro-optically active polymer 106, for example, in embodiments in which electronic device 100 is a photo voltaic cell or a PLED. The transparent electrodes may be selected from suitable transparent conductors such as, but not limited to, indium tin oxide (ITO), fluorine-doped tin oxide (FTO), or a high conductivity polymer. Other types of transparent electrodes that are made from networks of nanostructures, for example, may also be suitable for some embodiments of the current invention. The transparent electrodes 102 and 104 may be deposited on transparent substrates, such as plastic and/or glass substrates. FIG. 1(a) also shows portions 102a, 104a and 106a of the first transparent electrode 102, the second transparent electrode 104 and the electronically active polymer layer 106, respectively. The electronic device 100 can also include a buffer layer 108 of a low work function material formed on one of the transparent electrodes 102 and 104 to act as a low work function cathode. In the example of FIG. 1, the buffer layer 108 (portion at 108a) is formed on the second transparent electrode 104. The low work function material of the buffer layer 108 may be selected from materials that lower the electronic work function for the transparent electrode upon which it is formed. For example, the low work function material may be selected from, but is not limited to, cesium carbonate ($Cs_2CO_3$), cesium acetylacetonate, cesium fluoride, cesium chloride, cesium bromide, cesium iodide, potassium carbonate, potassium fluoride, potassium chloride, potassium bromide, potassium iodide, potassium acetylacetonate, sodium carbonate, sodium fluoride, sodium chloride, sodium bromide, sodium iodide, sodium acetylacetonate, rubidium carbonate, rubidium fluoride, rubidium chloride, rubidium bromide, rubidium iodide, rubidium acetylacetonate, and combinations thereof.

Figure 1B:
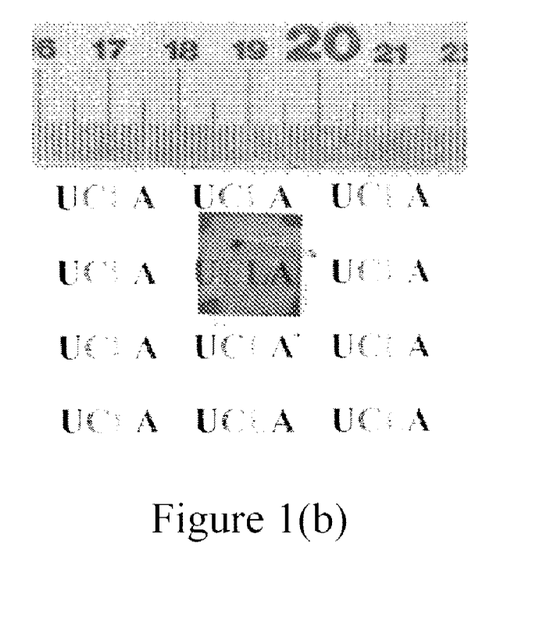
FIG. 1(b) is a photograph of a photovoltaic cell produced according to an embodiment of the current invention.
Figure 1C:
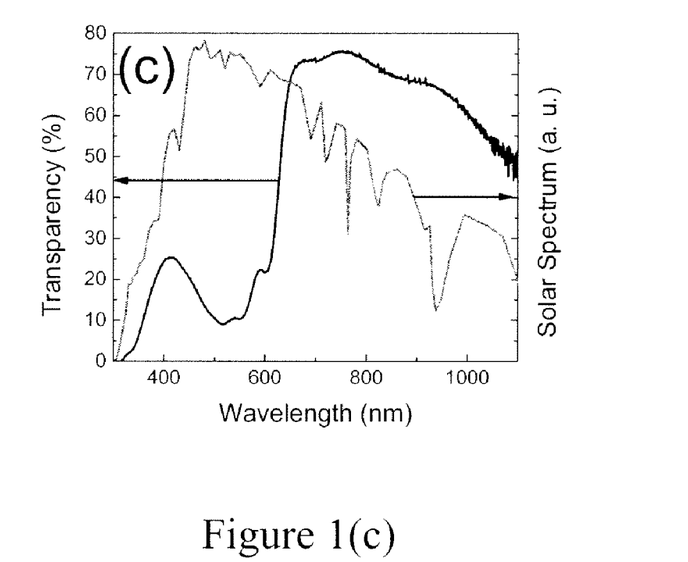
FIG. 1(c) shows transparency data for the device of FIG. 1(b) in conjunction with a graph of the solar spectrum.

The electronic device 100 can also include a layer of conducting polymer glue 110 (portion at 110a) formed on the first transparent electrode 102. The layer of conducting polymer glue 110 is a material that assists in forming a mechanical as well as an electrical bond between the first transparent electrode 102 and the electronically active polymer layer 106. In some embodiments, the conducting polymer glue 110 is substantially transparent to light within a wavelength range of interest. The conducting polymer glue 110 can be selected from, but is not limited to, poly-ethylenedioxythiophene:polystyrenesulfonate (PEDOT:PSS) modified by doping it with D-sorbitol or volemitol, erythritol, xylitol, mannitol, perseitol, D-threitol, dulcitol, beta-sedoheptiol, ethylene glycol, dimethyl sulfoxide and combinations thereof. The electronically active polymer layer 106 can be a polymer blend which can be regioregular poly(3-hexylthiophene) (RR-P3HT):[6,6]-phenyl-$C_{61}$-butyric acid methyl ester (PCBM), $C_{70}$-PCBM, $C_{84}$-PCBM, carbon nanotube, silicon nanowire, graphene, poly(pyridopyrazine vinylene), nanostructures (including nanowire, nanorod, nanoparticle and nanotube) of cadmium selenide (CdSe), cadmium telluride (CdTe), cadmium sulfide (CdS), lead sulfide (PbS), lead selenide (PbSe), lead telluride (PbTe), indium phosphide (InP), copper indium diselenide ($CuInSe_2$), copper indium gallium diselenide (CIGS) and combinations thereof. In some embodiments, the transparent electrodes 102 and 104 can be formed on transparent substrates, such as glass and/or plastic substrates FIG. 1(a) is also useful to help describe a device fabrication process according to an embodiment of the current invention. In a method of fabricating device 100 according to an embodiment of the current invention, the first transparent electrode 102 is produced by a solution process and a second transparent electrode 104 is produced by a solution process. The first and second electrodes may be formed on transparent substrates, for example. For example, two transparent substrates may be coated with a transparent conductor such as indium tin oxide (ITO), fluorine-doped tin oxide (FTO), or a high conductivity polymer according to some embodiments. One of the transparent electrodes is then coated with a very thin low work function buffer layer (e.g., cesium carbonate, $Cs_2CO_3$) (J. Huang, G. Li, E. Wu, Q. Xu, and Y. Yang. Achieving High-efficiency polymer white-light-emitting devices. *Adv. Mater.* 18, 114 (2006); J. Huang, T. Watanabe and K. Ueno and Y. Yang. Highly efficient red-emission polymer phosphorescent light-emitting diodes based on two novel tris (1-phenylisoquinolinato-C2,N) iridium(III) derivatives. *Adv. Mater.* Published online) to act as the low work function cathode. The electronically active polymer layer 106 is then formed on the combined second transparent electrode 104 and buffer layer 108. The layer of conducting polymer glue 110 is coated on the first transparent electrode 102. In the example of FIG. 1(a), we use a modified conducting polymer poly-ethylenedioxythiophene:polystyrenesulfonate (PEDOT:PSS) as the electronic glue, which is spin-coated to form an adhesive anode. The next step according to this embodiment is a lamination process: after drying both substrates, each with a transparent electrode (102, 104) formed thereon, they are laminated together by exerting force so that the two substrates are tightly glued together. The PEDOT:PSS was purposely modified to become adhesive, so that the two separate films form good contact at the interface, both electronically and mechanically (J. Ouyang, Y. Yang, Conducting polymer as transparent electric glue. Adv. Mater. 18, 2141 (2006)). In this example, this adhesive and conductive PEDOT:PSS layer was made by doping D-sorbitol or volemitol into PEDOT:PSS. The polymer blend used in this example is regioregular poly(3-hexylthiophene) (RR-P3HT):[6,6]-phenyl-$C_{61}$-butyric acid methyl ester (PCBM) in 1:1 wt. ratio. The polymer blend film was processed by the slow-growth method (or solvent annealing) to enhance device efficiency (G. Li, et al. High-efficiency solution processable polymer photovoltaic cells by self-organization of polymer blends. Nat. Mater. 4, 864 (2005); J. Huang, G. Li, and Y. Yang. Influence of composition and heat-treatment on the charge transport properties of poly(3-hexylthiophene) and [6,6]-phenyl $C_{61}$-butyric acid methyl ester blends. Appl. Phys. Lett. 87, 112105(2005); V. Shrotriya, Y. Yao, G. Li, and Y. Yang. Effect of self-organization in polymer/fullerene bulk heterojunctions on solar cell performance. Appl. Phys. Lett. 89, 063505 (2006)). Either glass or plastic, for example, can be used as the transparent substrates. FIG. 1(b) is a photograph of an all-plastic solar cell according to an embodiment of the current invention. The device area in this example is ~40 $mm^2$. With both the cathode and anode being transparent, a semitransparent polymer solar cell is thus formed. The transparency (T-%) of the device is shown in FIG. 1(c) together with the solar illumination spectrum. Transparency of around 70% is obtained in the wavelength range where polymer/PCBM has no absorption which makes this device suitable for application in stacking devices (V. Shrotriya, E. Wu, G. Li, Y. Yao, and Y. Yang. Efficient light harvesting in multiple-device stacked structure for polymer solar cells. Appl. Phys. Lett. 88, 064104 (2006)) to make full use of the solar spectrum.

Device fabrication according some embodiments of the current invention can have many advantages over that of conventional processes. First of all, no thermal evaporation processing is required according to some embodiments of the current invention and each layer can be coated by low-cost solution processing. Second, in contrast to the reactive metal cathode in conventional devices, the cathode according to some embodiments of the current invention can be very stable in air. Third, devices according to some embodiments of the current invention can be self-encapsulated if suitable substrates are selected. Fourth, methods of production according to some embodiments of the current invention can be used for large area device fabrication through roll-to-roll processes. In addition, all-plastic devices can be produced by using plastic materials for both of the substrates, the electronically active layer and appropriate selection of the electrode materials.

EXAMPLES

Figure 2A:
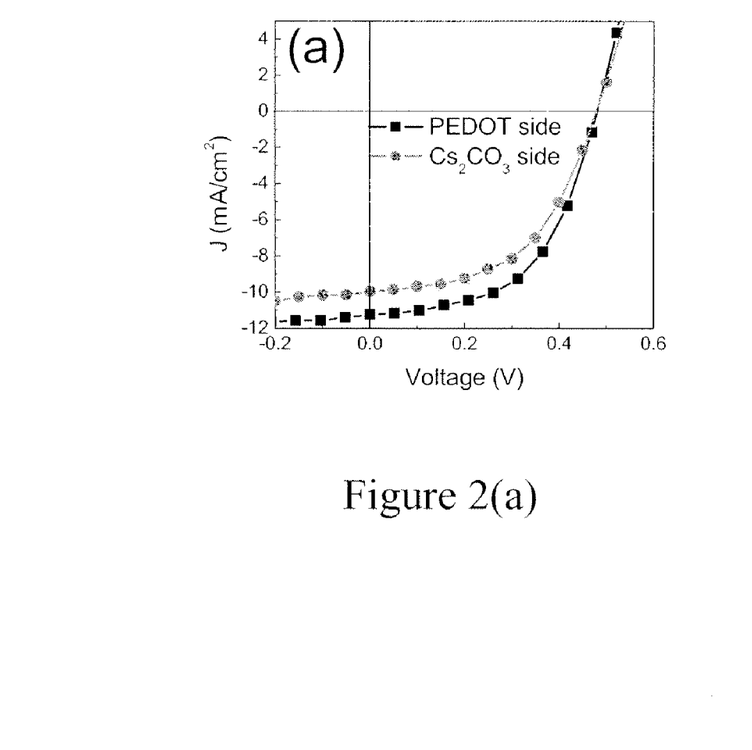
FIG. 2(a) shows photocurrent data for AM 1.5 simulated illuminations taken from the front and the back of a device produced according to an embodiment of the current invention.
Figure 2B:
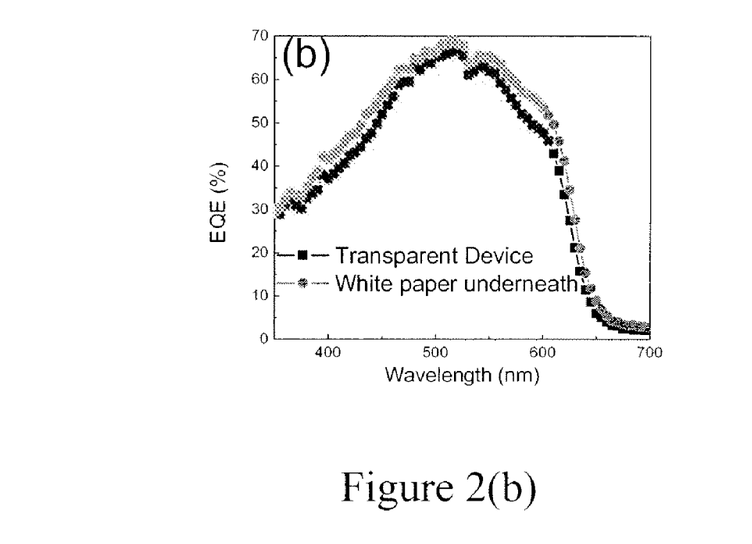
FIG. 2(b) shows the external quantum efficiency (EQE) of the device of FIG. 2(a) with and without a piece of white paper at the light exit side.

Devices according to an example for an embodiment of the current invention show high-quality mechanical and electrical contact between the laminated components. For a device area of ~40 mm$^2$, the rectification ratio is two to three orders in magnitude at ±2 V demonstrating good diode behavior. The series resistance of 12±3 Ω·cm$^2$ is derived from the dark current, which is several times higher than that of a conventional device. One possible origin of this higher series resistance is the high resistance of the ITO on plastic substrate used in this example (150 Ω/□ compared to ~15 Ω/□ for glass substrate). Despite the high sheet resistance, our laminated device has surprisingly high performance. Photocurrents were measured with the light shining from either side of the device, as well as with a piece of white paper placed behind the device. FIG. 2(a) shows the photocurrent density of the device under AM 1.5 simulated illumination of 100 mW/cm$^2$ (spectral mismatch corrected). The active area is defined by a photo mask of 4 mm$^2$. Short circuit current density ($J_{sc}$) of 11 mA/cm$^2$ from the ITO/PEDOT:PSS side, and 10 mA/cm$^2$ from the ITO/Cs$_2$CO$_3$ side are obtained. The $J_{SC}$ are actually a bit higher than that obtained from conventional devices (G. Li, et al. High-efficiency solution processable polymer photovoltaic cells by self-organization of polymer blends. Nat. Mater. 4, 864 (2005)). FIG. 2(b) shows the external quantum efficiency (EQE) of the device photo-excited from the PEDOT:PSS side with white paper on the back. The purpose of placing a piece of white paper behind the device is to redirect the unused light back to the device for additional absorption. The maximum EQE obtained is 67% at 514 nm for the transparent device, which further increases to close to 70% with a piece of white paper behind the device. One possible reason for the higher EQE than that of a conventional device is that the high conductivity PEDOT:PSS anode penetrates into the polymer layer and forms a high surface area structure during the lamination process. Under this scenario, the hole collection, which is a crucial process in P3HT:PCBM based devices for high efficiency, will be further enhanced by the increased interface area in this interpenetrating structure. A relatively good fill factor of 55% indicates that the contact between polymer blend and PEDOT: PSS layer is actually Ohmic. The open circuit voltage ($V_{OC}$) of the device is 0.48 V which is lower than that of the conventional device (0.6 V), possibly from the reduced work function of PEDOT:PSS by D-sorbital doping (J. Huang et al. Investigation of the effects of doping and post-deposition treatments on the conductivity, morphology, and work function of poly(3,4-ethylenedioxythiophene)/poly(styrene sulfonate) films. Adv. Funct. Mater. 15, 290 (2005)), and/or the high resistance of plastic ITO. The preliminary power efficiency obtained reaches 3% under AM 1.5 with spectral mismatch correction. Higher solar cell performance is feasible upon further optimization of parameters such as the ITO conductivity, the PEDOT:PSS conductivity and the work functions, etc.

Figure 2C:
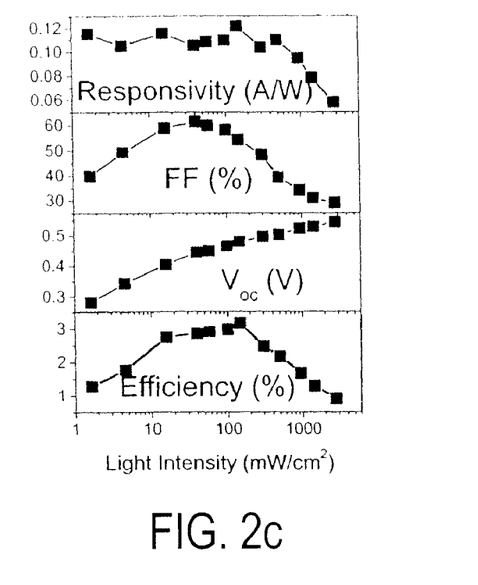
FIG. 2(c) shows the Responsivity, $V_{oc}$, fill factor (FF), and efficiency of the device of FIG. 2(a) under white light intensity from 1-2000 mW/cm$^2$.

We have studied the light-intensity dependent characteristics of examples of all solution processed devices according to some embodiments of the current invention. FIG. 2(c) shows the $V_{OC}$, fill factor (FF), responsivity ($J_{SC}/I_{light}$, where $I_{light}$ is the incident light power density-100 mW/cm$^2$) and efficiency under incident light power intensity ranging from 0.01-20 suns. Similar to conventional devices, the $V_{OC}$ keeps increasing across the full range. With the increased light intensity, FF first increases, reaches its maximum of 62% at half sun, and then begins to decrease at higher light intensity, which should result from the higher series resistance of plastic ITO (F. Yang, M. Shtein, S. R. Forrest, Controlled growth of a molecular bulk heterojunction photovoltaic cell. Nat. Mater. 4, 37. (2005)). Responsivity of the devices remains almost unchanged up to 5 suns, and then begins to decrease after that. The maximum power efficiency of 3.2% is obtained under 1.5 suns light intensity.

In our device in this example, a Cs$_2$CO$_3$ nano-layer plays the crucial role of replacing the low work-function reactive metal cathode, which makes the all solution processing possible. Besides Cs$_2$CO$_3$, a number of other salts have also been evaluated for this layer, including alkali carbonates from Li$_2$CO$_3$ to Cs$_2$CO$_3$, and cesium containing salts such as CsF, cesium acetylacetonate [Cs(acac)]. In order to exclude the effect of high resistance of plastic on device performance, an inverted structure solar cell (C. Waldauf et al. Highly efficient inverted organic photovoltaics using solution based titanium oxide as electron selective contact. Appl. Phys. Lett. 89, 233517 (2006)) structure is adopted for this evaluation. Inverted polymer solar cells have the structure of ITO/buffer layer/polymer:PCBM/V$_2$O$_5$ (10 nm)/Al, where V$_2$O$_5$ functions as the anode side and the buffer layer functions as the cathode side. The characteristic parameters of these solar cells with different buffer layers are summarized in Table 1. It is easy to deduce from the table that a thin layer of each of these materials can reduce the work function of ITO or FTO, but to different extents. Two distinct behaviors are clearly observed: firstly, for devices with buffer layer from Cs$_2$CO$_3$ to Li$_2$CO$_3$, the $V_{OC}$ drops, the $I_{SC}$ increases, and the series resistance reduces monotonically; secondly, for the devices with Cs-containing salt buffer layer with different anions [Cs$_2$CO$_3$, CsF, and Cs(acac)], all these characteristics are almost the same within the experimental error.

Figure 3A:
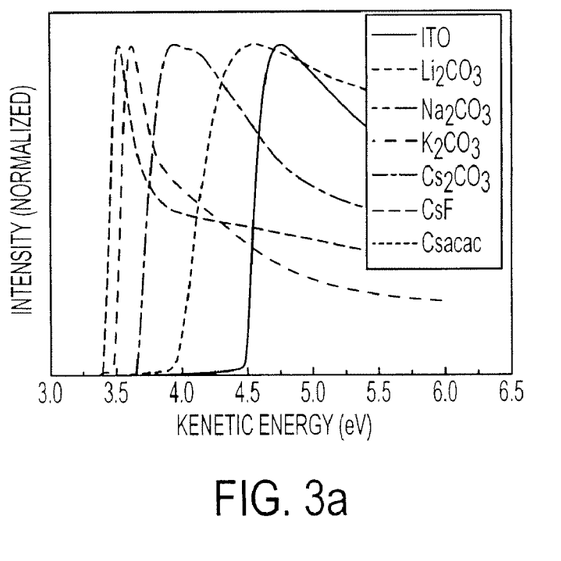
FIG. 3(a) shows the evolution of the secondary electron edge with different buffer layers on ITO.
Figure 3B:
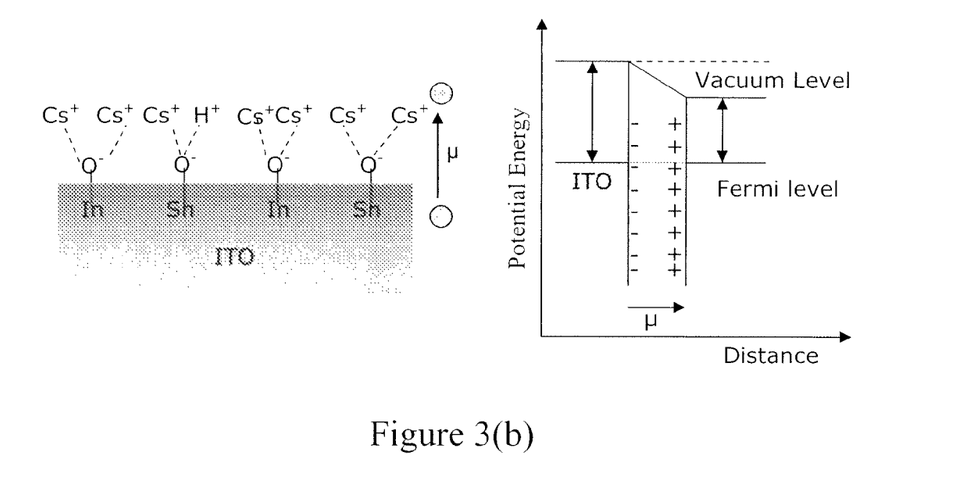
FIG. 3(b) is a schematic illustration to describe a scheme for the formation of a dipole layer on ITO and its effect on reducing the work function of ITO.

In order to investigate the detailed mechanism of the buffer layers, we conducted X-ray photoemission spectroscopy (XPS)/ultraviolet photoemission spectroscopy (UPS) analysis on the ITO/buffer layer interfaces. The preparations of the samples duplicates real device fabrication steps, i.e., the salts are spin-coated from the dilute aqueous solutions. The thickness of these layers were measured by the decay of X-ray signal intensity of indium according to $$I=I_0 e^{-L/L_0}$$

where $I_0$ and $I$ are the indium signal before and after spin-coating of the buffer layer, respectively, $L_0$ is the free electron path length at a specific energy, and $L$ is the thickness of the buffer layer. The thickness of the spin-coated salts is estimated to be about 0.6-3 nm depending on solution concentration and spin speed. It is clear that there are only a few monolayers of salt molecules on the ITO surface. FIG. 3(a) shows the secondary electron edge of ITO covered by these buffer layers, which provide information about the work function modification of ITO. The work function variation follows one clear trend: work function of ITO substrates reduces with buffer layers from Li-containing to Cs-containing salts, and buffer layers containing the same metal ion gives almost the same work function, which agrees well with the inverted solar cell performance. It is easy to infer that the work function is related only to the metal ions in the salt. Since there is a large change in the work function with the addition of only a few monolayers of molecules, it is believed that a strong dipole layer forms at the interface. The formation of such a dipole layer can be explained by such a scenario as illustrated in FIG. 3(b). A thin layer of O-M is formed at the ITO or FTO surface with metal ions in the vacuum side, where O and M stand for oxygen and metal species, respectively. The dipole points from ITO to vacuum and reduces the ITO surface work function. The dipole moment is directly related to the electron donating ability of metal species. Since the change in ITO work function is proportional to dipole moment (S. Khodabakhsh et al. Using self-assembling dipole molecules to improve hole injection in conjugated polymers. Adv. Funct. Mater. 14, 1205(2004)), the ITO surface with an O—Cs dipole layer has the lowest effective work function due to the highest dipole moment. The characteristics of the inverted solar cell can be well correlated to this dipole layer: $I_{SC}$ increases and series resistance reduces due to enhanced interfacial charge transfer rate at the cathode, and $V_{OC}$ (S. Khodabakhsh, B. M. Sanderson, J. Nelson, T. S. Jones. Using self-assembling dipole molecules to improve charge collection in molecular solar cells. Adv. Funct. Mater. 16, 95 (2006)) increases because of lower cathode work function before Fermi energy pinning (C. J. Brabec et al. Origin of the open circuit voltage of plastic solar cells. Adv. Funct. Mater. 11, 374 (2001)). There are two possibilities for formation of an O-M structure: (I) positive metal ions are directly attracted by the negative oxygen ions from ITO itself, particularly after the UV ozone process; (II) O-M replaces the hydroxyl group on the ITO surface by surface chemical reaction: —OH+ $M^+ \rightarrow$ —O—Cs+$H^+$, similar to chemisorption of Cl terminated molecules onto ITO (S. Khodabakhsh et al. Using self-assembling dipole molecules to improve hole injection in conjugated polymers. Adv. Funct. Mater. 14, 1205(2004)). In order to test the possibility of chemisorption, the atomic ratio of Cs to F was examined by XPS. CsF was chosen because it doesn't contain O or C species which might overlap signals from ITO substrates or ambient contamination. Another reason is that both Cs and F have high sensitivity in X-ray signals. The Cs/F ratio of 4.6-4.9 was obtained for CsF on ITO surface, which agrees with the second hypothesis (II).

It is straight forward to obtain an all-organic solar cell according to some embodiments of the current invention by simply replacing the ITO conductor with a high conducting polymer, for example. UPS results show that the work function of high conducting D-PEDOT film can be lowered down to around 3.5 eV by $Cs_2CO_3$ as well. Here we again employ the highly conductive (20 S/cm) modified PEDOT as the electrode to replace ITO. The thickness of D-PEDOT layer is about 150 nm (estimated sheet resistance is 3300 ohm/square). Our preliminary result has a short circuit current of 1-2 mA/cm$^2$ by applying the electronic glue as both cathode and anode for the device with area of 5 mm*5 mm. Further optimization should allow increasing the conductivity of the conducting polymer.

Figure 4A:
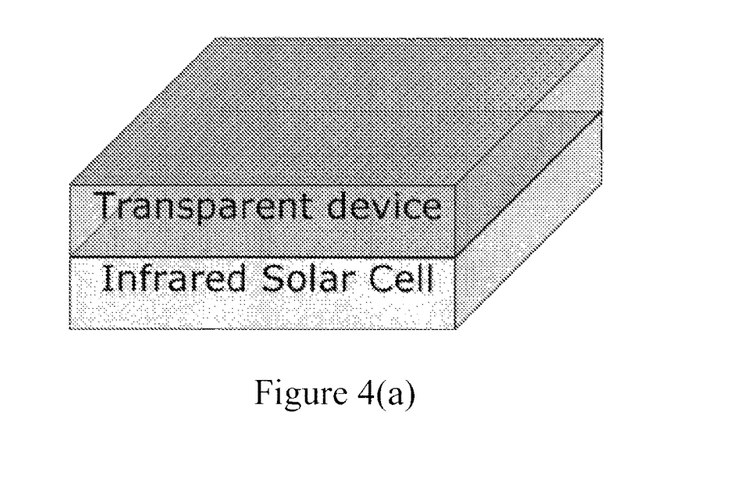
FIGS. 4(a), 4(b) and 4(c) are schematic illustrations of a few possible solar cell embodiments according to the current invention.
Figure 4B:
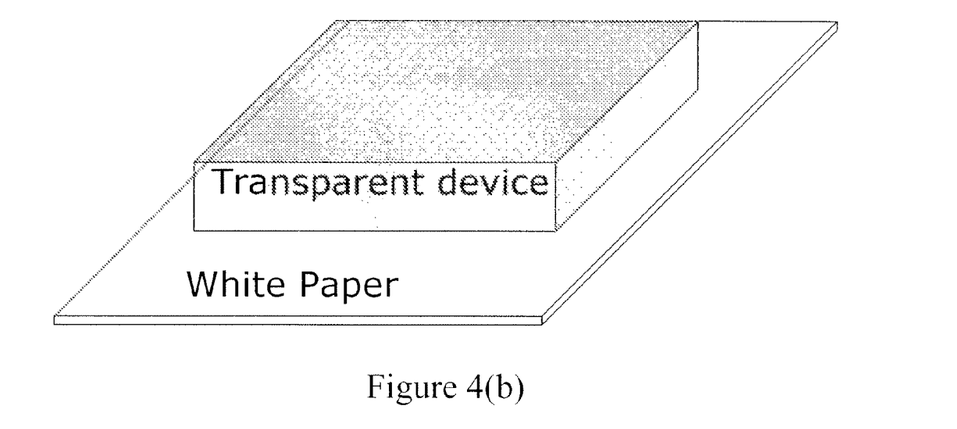
Figure 4C:
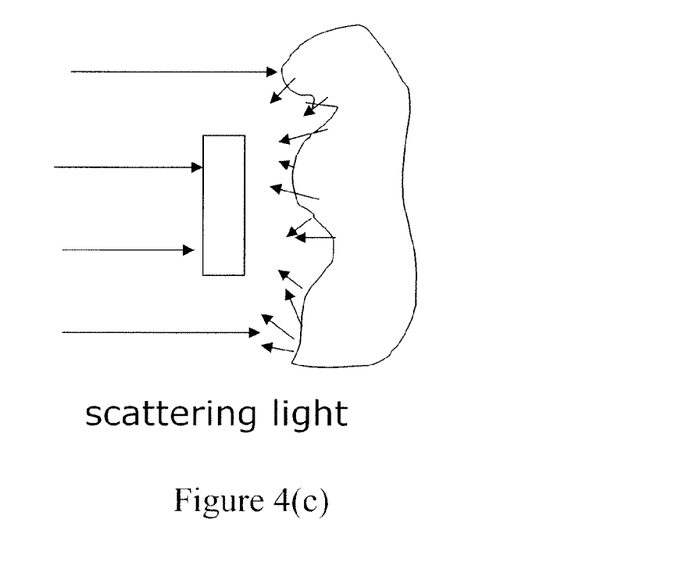
Figure 5:
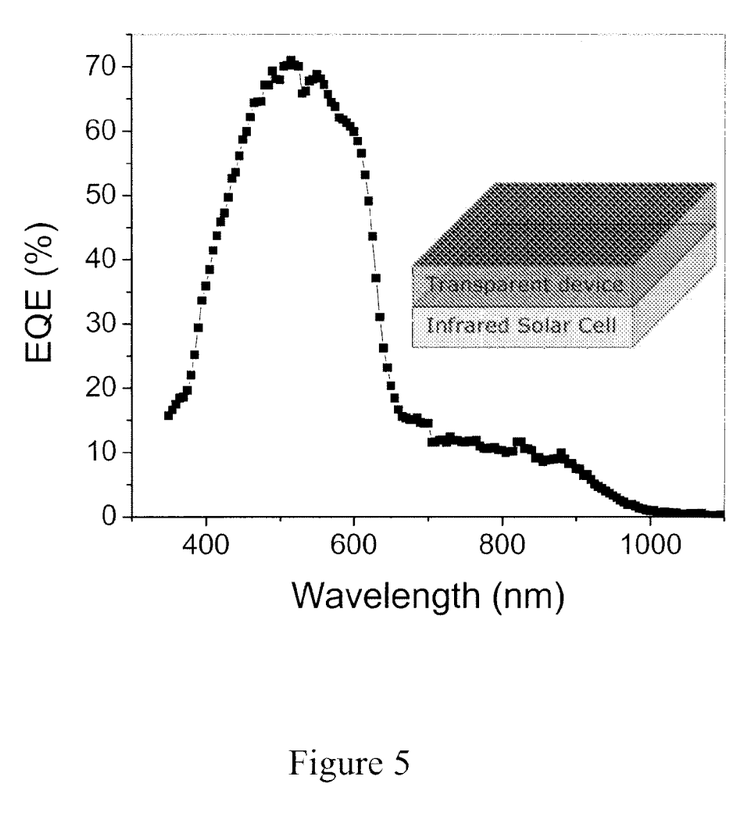
FIG. 5 shows the external quantum efficiency (EQE) of stacked solar cells, according to an embodiment of the current invention, each of which has a different optical response wavelength range.

There are many applications for devices according to various embodiments of the current invention. FIGS. 4(a)-4(c) show three configurations of applications for highly efficient solar cells: (a) a stacking device, (b) a non-stacking device, and (c) a high-efficiency device. First of all, the high transparency of devices according to some embodiments of the current invention is suitable for stacking applications. By combining devices that absorb in different wavelength regions, a larger portion of the sun's radiation can be used. FIG. 1(c) shows the transparency of devices according to some embodiments of the current invention. It has high transparency (60-80%) in the wavelength range between 700-900 nm. The absorption of PEDOT reduces the transparency for wavelengths longer than 900 nm, nevertheless the device still has transparency higher than 50% in this region. The stacking device is demonstrated here by putting one organic solar cell which absorbs infrared irradiation (700-1000 nm). By connecting the two devices in parallel, high short circuit current of 13 mA/cm$^2$ is obtained and its EQE is shown in FIG. 5. Secondly, for non-stacking applications, one can put a reflector (mirror) or scattering object (e.g., a piece of white paper) under the device to scatter the transmitted light and cause it to be reabsorbed by the active layer. Encouragingly, exactly the same short circuit current and same external quantum efficiency were obtained with the mirror and white paper reflector in our P3HT:PCBM based devices. And thirdly, it can be used to absorb the direct-incident sun light as well as the scattered light. One unique property of devices according to some embodiments of the current invention is that they have nearly the same efficiency when the incident light comes from either side. As illustrated in FIG. 4(c), light scattered from the ground can also be absorbed by the device, and hence it decreases the device area required to obtain the same power, i.e., the effective power efficiency is improved.

Another application for such a structure according to some embodiments of the current invention is for windows with solar conversion of some incident light. In this case, the polymer blend can be selected to absorb predominantly infrared and UV light, but to pass visible light with little noticeable effect. This embodiment of the current invention can provide windows that appear transparent to the user and, at the same time, that generate energy. In addition, infrared light that is absorbed by windows according to this embodiment of the current invention does not contribute to heating the interior of the building when it is entering from the outside. In summer months and/or in warm climates, this can provide a double benefit of energy savings by reducing the amount of cooling needed as well as providing energy production. In addition, infrared radiation leaving a building through the window, for example during winter months, can be absorbed and converted to electrical power.

Although solar cells were described in some particular examples, the current invention is not limited to only solar cells. Other embodiments of the current invention can include other organic electronic devices, such as polymer light emitting diode (PLEDs), organic transistors, and organic memory devices, for example, and methods of producing such devices. For example, PLED fabrication is similar to that of the solar cell fabrication except for the replacement of the active layer by a light emitting polymer.

The current invention was described with reference to particular embodiments and examples. However, this invention is not limited to only the embodiments and examples described. One of ordinary skill in the art should recognize, based on the teachings herein, that numerous modifications

TABLE I

Voc, Jsc, and Rs of inverted solar cells using different buffer layer:

| | Cs(acac) | CsF | $Cs_2CO_3$ | $K_2CO_3$ | $Na_2CO_3$ | $Li_2CO_3$ | ITO |
|---|---|---|---|---|---|---|---|
| $V_{oc}$ (V) | 0.55 | 0.54 | 0.56 | 0.56 | 0.50 | 0.26 | 0.20 |
| $J_{sc}$ (mA/$cm^2$) | 9.64 | 8.34 | 9.70 | 9.62 | 8.91 | 8.57 | 7.01 |
| $R_s$ ($\Omega \cdot cm^2$) | 3.56 | 4.19 | 3.50 | 3.78 | 8.60 | 20.3 | 18.2 |

We claim:

1. A method of producing an electronic or electro-optic device, comprising:
   producing a first electrode by a solution process;
   producing a second electrode by a solution process;
   laminating an active polymer layer between said first and second electrodes; and
   forming a layer of a conducting polymer glue on said first electrode,
   wherein said conducting polymer glue is selected from the group consisting of poly-ethylenedioxythiophene: polystyrenesulfonate (PEDOT:PSS) modified by doping it with at least one of D-sorbitol and volemitol, erythritol, xylitol, mannitol, perseitol, D-threitol, dulcitol, beta-sedoheptiol, ethylene glycol, Dimethyl sulfoxide, and combinations thereof.

2. The method according to claim 1, further comprising providing a first transparent substrate that is substantially transparent to light having a wavelength in a visible spectral range of wavelengths,
   wherein said producing said first electrode comprises forming a first transparent electrode on said first transparent substrate, said first transparent electrode being substantially transparent to light having a wavelength in the visible spectral range of wavelengths.

3. The method according to claim 2, further comprising providing a second transparent substrate that is substantially transparent to light having a wavelength in the visible spectral range of wavelengths,
   wherein said producing said second electrode comprises forming a second transparent electrode on said second transparent substrate, said second transparent electrode being substantially transparent to light having a wavelength in the visible spectral range of wavelengths.

4. The method according to claim 1, further comprising forming a buffer layer of a low work function material on said second electrode.

5. The method according to claim 3, further comprising forming a buffer layer of a low work function material on said second transparent electrode.

6. The method according to claim 4, wherein said low work function material of said buffer layer is $Cs_2CO_3$ (cesium carbonate).

7. The method according to claim 5, wherein said low work function material of said buffer layer is selected from the group consisting of $Cs_2CO_3$ (cesium carbonate), cesium acetylacetonate, cesium fluoride, cesium chloride, cesium bromide, cesium iodide, potassium carbonate, potassium fluoride, potassium chloride, potassium bromide, potassium iodide, potassium acetylacetonate, sodium carbonate, sodium fluoride, sodium chloride, sodium bromide, sodium iodide, sodium acetylacetonate, rubidium carbonate, rubidium fluoride, rubidium chloride, rubidium bromide, rubidium iodide, rubidium acetylacetonate, and combinations thereof.

8. The method according to claim 1, wherein said conducting polymer glue is poly-ethylenedioxythiophene: polystyrenesulfonate (PEDOT:PSS) modified by doping it with at least one of D-sorbitol and volemitol.

9. The method according to claim 1, wherein said laminating said active polymer layer between said first and second electrodes includes applying pressure to said first electrode, said active polymer layer and said second electrode to cause mechanical bonding and electrical connectivity thereof.

10. The method according to claim 3, wherein said laminating said active polymer layer between said first and second electrodes includes applying pressure to said first transparent substrate, said active polymer layer and said second transparent substrate to cause mechanical bonding and electrical connectivity between said first transparent electrode and said active polymer layer and between said second electrode and said active polymer layer.

11. The method according to claim 1, wherein said electronic or electro-optic device consists essentially of non-metallic materials.

12. The method according to claim 1, wherein said electronic or electro-optic device consists essentially of organic materials.

13. The method according to claim 1, wherein said laminating said active polymer layer between said first and second electrodes is a roll-to-roll process suitable for high volume production of large electronic or electro-optic devices.

14. The method according to claim 12, wherein said laminating said active polymer layer between said first and second electrodes is a roll-to-roll process suitable for high volume production of large electronic or electro-optic devices.

15. An electronic or electro-optic device produced by the method of any one of claims 1 to 7, 8 or 9 to 14.

16. The electronic device according to claim 15, wherein said electronic device is one of a polymer solar cell, a stacked polymer solar cell, a polymer light emitting diode, an organic transistor and an organic memory device.

17. The electronic device according to claim 15, wherein said electronic device is a glass window pane having a polymer solar cell attached at least to a portion thereof.

18. An organic electronic or electro-optic device, comprising:
   a first electrode consisting essentially of organic material;
   a second electrode consisting essentially of organic material;
   an active polymer layer arranged between said first and second electrodes; and
   a conductive polymer glue disposed between said first electrode and said active polymer layer,
   wherein said conductive polymer glue provides mechanical bonding and electrical connection of said first electrode to said active polymer layer,
   wherein said conducting polymer glue is selected from the group consisting of poly-ethylenedioxythiophene: polystyrenesulfonate (PEDOT:PSS) modified by doping it with at least one of D-sorbitol and volemitol, erythritol, xylitol, mannitol, perseitol, D-threitol, dulcitol, beta-sedoheptiol, ethylene glycol, Dimethyl sulfoxide, and combinations thereof.

19. The device according to claim 18, further comprising a buffer layer of a low work function material on said second electrode.

20. The device according to claim 19, further comprising a glass window pane upon which said first electrode, second electrode and said active polymer layer combined structure is attached such that said electronic or electro-optic device is a window structure.

* * * * *